United States Patent [19]

Weingartner et al.

[11] 4,396,990
[45] Aug. 2, 1983

[54] CHECKING SYSTEM FOR CHECKING THE FUNCTIONAL INTEGRITY OF THE OPERATING MAGNETS IN A FLATBED KNITTING MACHINE

[75] Inventors: Albin K. Weingartner; David A. Retallick, both of Munich, Fed. Rep. of Germany

[73] Assignee: Universal Maschinenfabrik Dr. Rudolf Schieber GmbH & Co. KG, Westhausen, Fed. Rep. of Germany

[21] Appl. No.: 190,770

[22] Filed: Sep. 25, 1980

[30] Foreign Application Priority Data

Oct. 1, 1979 [DE] Fed. Rep. of Germany ........ 2939736

[51] Int. Cl.³ .................... G06F 15/46; D04B 7/00
[52] U.S. Cl. .................... 364/551; 66/75.2; 371/20; 371/29
[58] Field of Search ............ 364/550, 551, 480, 481, 364/552, 579, 146; 371/20, 21, 29; 324/205, 216, 227, 234, 243; 66/75.2

[56] References Cited

U.S. PATENT DOCUMENTS

| | | | |
|---|---|---|---|
| 2,781,127 | 2/1957 | Becker, Jr. | 324/205 |
| 3,697,867 | 10/1972 | Kleesattel | 324/227 |
| 4,034,194 | 7/1977 | Thomas et al. | 371/20 |
| 4,320,506 | 3/1982 | Farazi et al. | 371/20 |

*Primary Examiner*—Errol A. Krass
*Attorney, Agent, or Firm*—Sughrue, Mion, Zinn, Macpeak and Seas

[57] ABSTRACT

A system for checking the functional state of the operating magnets in a flatbed knitting machine includes a microprocessor, a keyboard, a display unit, and sensors detecting short-circuit and open-circuit conditions in the magnets and their connections. In order to avoid dismantling the machine to check the magnets, the magnets are subjected in turn to pulse sequences at respective different frequencies and their behavior is monitored. One can monitor the vibrational noise of the magnets or the rise time of current and voltage in the magnets. The checking process can be initiated automatically, for example each time the machine is started up, or controlled manually via the keyboard. Frequencies within the range of 1 to 50 Hz are preferably used.

11 Claims, 2 Drawing Figures

F I G. 1
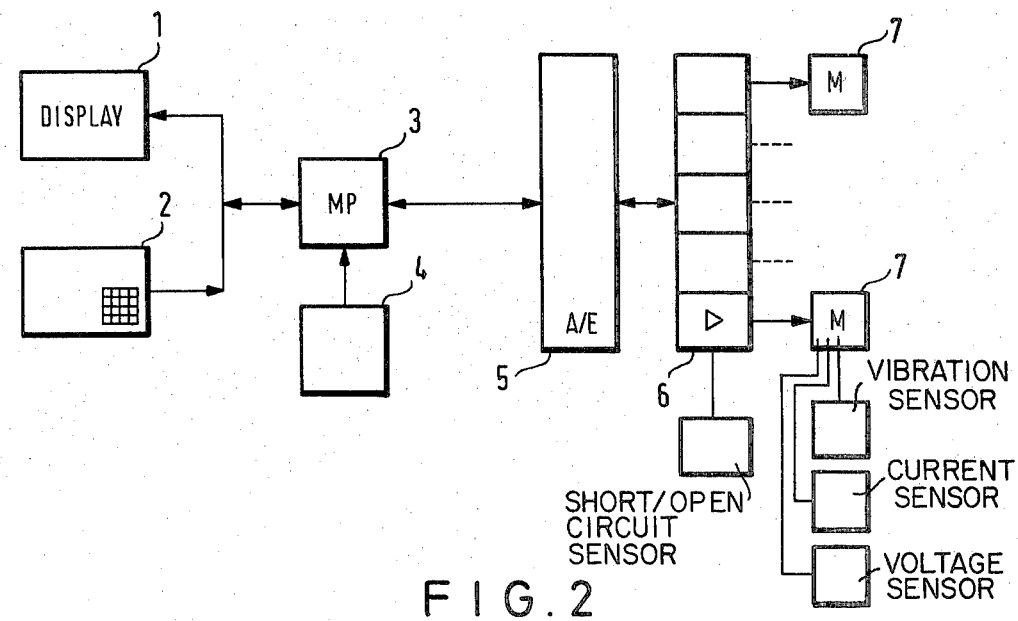
F I G. 2
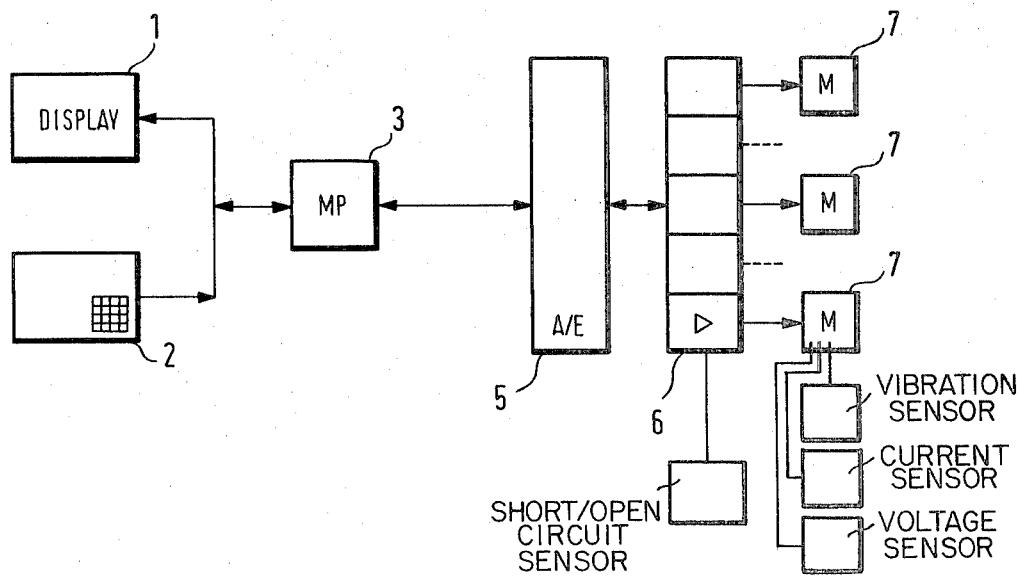

CHECKING SYSTEM FOR CHECKING THE FUNCTIONAL INTEGRITY OF THE OPERATING MAGNETS IN A FLATBED KNITTING MACHINE

FIELD OF THE INVENTION

This invention relates to a checking system for checking the functional integrity of the operating magnets in a flatbed knitting machine. The checking system finds particular application in flatbed knitting machines provided with electronic control.

DESCRIPTION OF THE PRIOR ART

Checking the functional integrity of the operating magnets in a flatbed knitting machine, some of which magnets are extremely inaccessible, has until now only been possible by time-consuming dismantling of the flatbed knitting machine and by checking from outside the machine.

U.S. Pat. No. 4,015,445 describes a flatbed knitting machine comprising a computer, an associated keyboard, a display device, and an input/output unit and amplifier for control magnets, in which an error indication is only produced as a result of a faulty reading of the program cards into the computer. A checking system for checking the functional integrity of the control magnets is not provided.

SUMMARY OF THE INVENTION

It is an object of the present invention to provide a checking system for checking the functional integrity of the operating magnets in a flatbed knitting machine, which makes it possible to carry out a rapid functional examination, for example each time that the flatbed knitting machine is started up, using a simple fault-finding procedure without dismantling the operating magnets or other components of the machine.

This is achieved in accordance with the present invention by a checking system comprising a microprocessor, a keyboard connected to the microprocessor, display means, sensor means for detecting short-circuit and open-circuit conditions, and an output/input unit and amplifier means connected between the microprocessor and each magnet, the system being connected in such a way that the individual magnets are subjected in turn to pulse sequences, the energised and/or de-energised behavior of the magnets is detected, and the functional integrity of the magnets based on the detected behavior is indicated on the display means.

By the choice of different frequencies for different operating magnets one is able in a simple way to distinguish between the individual operating magnets.

Preferably, the microprocessor is connected in such a way that the magnets are energised and de-energised by the application of respective different frequencies within the range of 1 and 50 Hz.

Sensors for detecting the energised and de-energised noise of the magnets can be connected to the microprocessor, or the microprocessor can be connected up in such a way that the rise time of current and voltage in the magnets is detected. In the case where one is monitoring the functional state of the operating magnets on the basis of the vibrational noise, it is possible to provide additional direct acoustic checking by a skilled operator of the flatbed knitting machine.

For a manual checking of the individual magnets, the microprocessor is preferably connected to a cyclic pulse generator and is connected in such a way that the pulse sequences are fed to the individual magnets each on the basis of a signal supplied by the keyboard.

For an automatic monitoring, the microprocessor is advantageously connected in such a way that the pulse sequences are fed automatically to the magnets on the order of a signal supplied to the microprocessor. The signal may be supplied to the microprocessor by the keyboard and/or upon starting up of the machine and/or intermittently during the operation of the machine.

The microprocessor can be connected in such a way that it produces a stop signal for the machine if one or more magnets become defective, so that one thus achieves a reliable switching off of the machine.

According to an especially advantageous arrangement, the microprocessor is connected in such a way that the functional state of the magnets together with an identification of the respective magnets is indicated on the display means. This facilitates the repair or the replacement of the non-functioning magnet or magnets.

It will be appreciated that as well as checking the magnets themselves, the connections to the magnets are also checked by this system.

Preferably, the amplifier means includes the sensor means for detecting short-circuit and open-circuit conditions.

BRIEF DESCRIPTION OF THE DRAWINGS

In order that the invention may be fully understood, two embodiments of a checking system in accordance with the invention will now be described by way of example and with reference to the accompanying drawings, in which:

FIG. 1 is a block schematic diagram of a checking system designed for manual operation; and, FIG. 2 is a block schematic diagram of a checking system designed for automatic operation.

DESCRIPTION OF THE PREFERRED EMBODIMENTS

The checking system shown in FIG. 1 comprises a microprocessor 3 which is connected to a display device 1 and to a keyboard 2. The microprocessor 3 can be formed as a minicomputer. A cyclic pulse generator 4 is connected to the microprocessor 3. The microprocessor 3 is connected to the individual magnets 7 of a flatbed knitting machine by means of a common input/output unit 5 and by way of respective individual amplifiers 6. Within the amplifiers 6 are sensors for detecting short-circuits and for detecting an open circuit condition of the magnets 7.

The checking system shown in FIG. 2, which is for automatic operation, differs from the checking system shown in FIG. 1, which is for manual operation, in that no special cyclic pulse generator 4 is provided.

The checking system shown in FIG. 1 operates as follows. First, the magnet 7 which is to be examined is selected by means of the keyboard 2. By means of the microprocessor 3 and the cyclic pulse generator 4, the amplifier 6 associated with the magnet 7 which is to be examined is brought into action by way of the input/output unit 5. The appropriate magnet 7 is brought to the point of vibration by applying a pulse sequence at a frequency of between 3 and 50 Hz. Different frequencies are associated with the individual magnets 7.

Upon the occurrence of a fault, the particular fault which is present is displayed on the display unit 1 with an identification of the particular magnet 7 which is at fault. Thus, if for example magnet No. 10 will not vibrate, then the indication "magnet No. 10 sticking" is displayed; in the case of a short-circuited magnet No. 10, the indication "magnet No. 10 short" is displayed; and in the case of a broken magnet coil for magnet No. 10 or in the case of a broken connection to the magnet No. 10, the indication "magnet No. 10 open" is displayed.

The checking system shown in FIG. 2 for automatic checking, which is especially suitable for the reliable switching off of the machine in the event of a fault, operates as follows. By means of the keyboard 2 the automatic checking process is initiated. Alternatively, the automatic checking process can be arranged to run automatically every time that the machine is started up, as soon as the machine is switched on. Within two seconds after the initiation of the checking process the microprocessor 3 checks all the magnets 7.

If all the magnets 7 are in order, there appears on the display unit 1 the signal "magnets OK". If, as the result of a defective magnet coil for example, magnet No. 11 is short-circuited, there appears on the display unit 1 the indication "magnet No. 11 short". If the connection to magnet No. 11 or the magnet coil of magnet No. 11 is broken, then there appears on the display unit 1 the indication "magnet No. 11 open". Simultaneously with the display of the presence of a faulty magnet 7, a command to stop the machine is initiated and interrupts the operation of the machine.

For the sake of completeness it is pointed out that by subjecting the individual magnets to pulse sequences at different frequencies, any damage to a magnet can be recognised and evaluated purely acoustically by a trained operator.

We claim:

1. An electromagnetically controlled flatbed knitting machine comprising a checking system for checking the operating state of operating magnets in said machine, said system comprising:

amplifier means for feeding pulse sequences to said operating magnets in response to respective control signals;

control means, including at least a microprocessor and a keyboard connected thereto, for selectively providing said control signals to said amplifier means, said control signals having different frequencies according to different functions of said operating magnets;

sensing means having outputs monitored by said microprocessor for sensing whether or not each operating magnet operates properly in response to said control signals; and display means controlled by said microprocessor in accordance with the monitored sensing means outputs for indicating whether or not each operating magnet is operating properly.

2. A knitting machine according to claim 1, wherein said amplifier means energizes and de-energizes said magents at respective different frequencies within the range of 1 to 50 Hz.

3. A knitting machine according to claim 1, wherein said sensing means includes sensors connected to the microprocessor for detecting noise which occurs upon energization and de-energization of said magnets.

4. A knitting machine according to claim 1, wherein said microprocessor monitors the rise time of current and voltage in said magnets.

5. A knitting machine according to claim 1, wherein said control means includes a cyclic pulse generator connected to the microprocessor for providing said pulse sequences to the individual magnets each on the basis of a signal supplied by said keyboard.

6. A knitting machine according to claim 1, in which said control means automatically feeds said pulse sequences to the magnets in response to a signal supplied to the microprocessor.

7. A knitting machine according to claim 6, in which the signal supplied to said microprocessor is supplied by the keyboard and/or automatically upon starting up of the machine and/or intermittently during operation of the machine.

8. A knitting machine according to claim 1, in which said control means generates a signal to stop the machine in the event of a defeat being detected in one or more of the magnets.

9. A knitting machine according to claim 1, in which the microprocessor controls said display means to display the functional state of the magnets and also an identification of the respective magnets.

10. A knitting machine according to claim 1, which includes a separate amplifier provided for each magnet.

11. A knitting machine according to claim 1, in which the amplifier means includes sensor means for detecting short-circuit and open-circuit conditions.

* * * * *